United States Patent
Zweers et al.

(10) Patent No.: US 9,487,344 B2
(45) Date of Patent: Nov. 8, 2016

(54) CARRIER FOR SEPARATED ELECTRONIC COMPONENTS AND METHOD FOR VISUAL INSPECTION OF SEPARATED ELECTRONIC COMPONENTS

(75) Inventors: Johannes Gerhardus Augustinus Zweers, Wehl (NL); Jurgen Hendrikus Gerhardus Huisstede, Goor (NL)

(73) Assignee: Besi Netherlands B.V., Duiven (NL)

( * ) Notice: Subject to any disclaimer, the term of this patent is extended or adjusted under 35 U.S.C. 154(b) by 593 days.

(21) Appl. No.: 13/883,381

(22) PCT Filed: Nov. 3, 2011

(86) PCT No.: PCT/NL2011/050749
§ 371 (c)(1),
(2), (4) Date: Jul. 30, 2013

(87) PCT Pub. No.: WO2012/060703
PCT Pub. Date: May 10, 2012

(65) Prior Publication Data
US 2013/0300857 A1   Nov. 14, 2013

(30) Foreign Application Priority Data

Nov. 4, 2010   (NL) .................................... 2005626

(51) Int. Cl.
| H01L 23/13 | (2006.01) |
| B65D 85/30 | (2006.01) |
| H01L 21/673 | (2006.01) |
| H04N 7/18 | (2006.01) |

(52) U.S. Cl.
CPC ......... B65D 85/30 (2013.01); H01L 21/67336 (2013.01); H04N 7/18 (2013.01)

(58) Field of Classification Search
CPC ..... B65D 85/42; H01L 21/673; H01L 23/32; H01L 23/13

USPC .......................................................... 348/92
See application file for complete search history.

(56) References Cited

U.S. PATENT DOCUMENTS

| 5,120,577 A | 6/1992 | Yamaguchi et al. |
| 5,337,893 A | 8/1994 | Nami et al. |
| 5,546,654 A * | 8/1996 | Wojnarowski ......... H05K 3/284 279/3 |
| 5,971,156 A * | 10/1999 | Slocum ............. H01L 21/67333 206/560 |
| 6,137,303 A * | 10/2000 | Deckert ............. G01R 31/2831 324/757.03 |
| 6,227,372 B1 * | 5/2001 | Thomas ............ H01L 21/67336 206/454 |
| 2002/0186034 A1 | 12/2002 | Keating |
| 2004/0048009 A1 * | 3/2004 | Extrand ................. B32B 25/08 428/34.1 |
| 2005/0051195 A1 * | 3/2005 | Kamikawa ........ H01L 21/67766 134/25.1 |
| 2007/0163920 A1 * | 7/2007 | Sasaki ............... H01L 21/67333 206/725 |
| 2008/0187722 A1 * | 8/2008 | Waldman ................ H01L 23/13 428/192 |

(Continued)

FOREIGN PATENT DOCUMENTS

| DE | 3839891 A1 | 6/1989 |
| GB | 2339568 A | 2/2000 |

(Continued)

Primary Examiner — Sath V Perungavoor
Assistant Examiner — Clifford Hilaire
(74) Attorney, Agent, or Firm — The Webb Law Firm

(57) ABSTRACT

Provided is a flat carrier provided with holders for separated electronic components, comprising: a flat metal platform with a space recessed therein and an epoxy carrier structure which is arranged form-fittingly in this space and which is provided with holders for the separated electronic components. Also provided is a method for visual inspection of separated electronic components located on such a flat carrier.

11 Claims, 2 Drawing Sheets

(56) References Cited

U.S. PATENT DOCUMENTS

2009/0123257 A1    5/2009  Zin et al.
2012/0038763 A1\*  2/2012  Kawada ................ B23B 25/06
                                                        348/95

FOREIGN PATENT DOCUMENTS

| JP | 200493347 A | 3/2004 |
| JP | 20073326 A | 1/2007 |
| WO | 2007126393 A2 | 11/2007 |

\* cited by examiner

CARRIER FOR SEPARATED ELECTRONIC COMPONENTS AND METHOD FOR VISUAL INSPECTION OF SEPARATED ELECTRONIC COMPONENTS

BACKGROUND OF THE INVENTION

Field of the Invention

The present invention relates to a carrier for separated electronic components and to a method for visual inspection of separated electronic components.

Description of Prior Art

During the process of manufacturing electronic components, such as more particularly semiconductor products, these are usually separated (which can also be referred to as singulated or divided) from a larger unit of electronic components in which the electronic components are produced. Examples of such larger assemblies of electronic components are strips, boards and wafers, in which many optionally encapsulated electronic components are brought together as one whole. During the subsequent separation (also referred to as release, singulating or individualizing) of the electronic components use is made of, among other methods, more classical machining processes such as sawing and milling, of liquid jet cutting or laser cutting. The separated electronic components are then usually set down on—or in—a carrier. With the carrier as product carrier the separated electronic components can be transported to one or more subsequent processing stations. A specific process following the separation is the visual inspection, wherein the external diameter and other aspects of the components are examined. According to the prior art the separated electronic components are placed on a metal carrier plate, which carrier plate is then displaced past a camera system (vision system) such that image recordings of the separated electronic components can be made with the camera. This makes it possible to select the separated electronic components, for instance according to quality, such as for instance by removing separated electronic components which deviate from the norm. A drawback of the existing methods of inspecting separated electronic components is that they have a limited accuracy, for instance because they produce a distracting brightness during a visual check. Another problem of the existing carriers for separated electronic components is that the possible presence of uncontrolled electrostatic charge (Electro Static Discharge, ESD) may damage the often extremely sensitive electronic components.

An object of the present invention is to provide a carrier for separated electronic components whereby the chance of waste as a result of ESD is reduced compared to the prior art.

Another object of the present invention is to provide a carrier and a method for visual inspection of separated electronic components with which the quality of visual inspection can be increased.

SUMMARY OF THE INVENTION

The invention provides for this purpose a flat carrier provided with holders for separated electronic components, comprising: a flat metal platform provided with a space recessed into the flat metal platform, which recessed space is opened to one of the flat sides of the flat metal platform, and an epoxy carrier structure arranged form-fittingly in the recessed space, wherein the holders for the separated electronic components are formed from the epoxy of the carrier structure. The advantage of this construction is that the assembled structure has a high degree of form-retention because of the metal platform, and that this metal platform moreover makes the carrier robust and therefore durable. This robustness is however combined with the advantages which can be gained using the epoxy carrier structure. These advantages are that, owing to the freedom in the choice of epoxy and the freedom in the choice of finishing of the contact layer of the epoxy, a high visual contrast can be created between the separated electronic components to be held and the epoxy; this results in an enhanced quality of an optional subsequent visual inspection of the separated electronic components. A further advantage is that the dissipative capacity of the epoxy can be fully controlled. The electrostatic charge can thus be completely or incompletely discharged in fully controlled manner through the choice of a specific dissipative capacity, without the danger of a contact surface of the carrier being electrically conductive such that the separated electronic components can be subjected to peak load. Yet another advantage is that the epoxy can be easily processed such that the lifespan of (machining) production means for manufacturing purposes is relatively long while there is moreover great freedom of design in the manufacture of the holders for the separated electronic components. The carriers according to the invention can moreover be produced efficiently. It has been found advantageous in practice to have the contact side of the epoxy and the edge of the metal platform connecting thereto connect to each other in one surface, among other purposes so as to minimize fouling of the carrier and not form an obstruction in subsequent processes. A form-fitting coupling of the platform and the epoxy is relevant because the form-retention of the carrier as a whole can thus be controlled. Another advantage of applying the epoxy carrier structure is that the frictional resistance encountered by the separated electronic components from the carrier can hereby be kept low, which facilitates accurate (self-positioning) placing of the separated electronic components in a determined position relative to the carrier; that a high positional accuracy is advantageous in subsequent processes will be evident. Furthermore, very compact components can hereby also be processed with the carrier according to the invention.

In a variant of the present invention the space recessed into the flat metal platform is opened to only one of the flat sides of the flat metal platform. With the exception of the side that is left clear, the epoxy carrier structure is thus wholly enclosed by the metal platform. This geometry in combination with the form-fitting of the epoxy in the platform creates a very firm coupling between epoxy and platform. Undesirable release of these individual components from each other is therefore wholly precluded.

The holders for the separated electronic components can for instance be formed by receiving spaces recessed into the epoxy, whereby the position of the separated electronic components on the carrier is secured, at least in the surface of the carrier. In order to increase the positioning accuracy of the separated electronic components it is advantageous for the receiving spaces recessed into the epoxy to be provided with chamfered positioning edges. The positioning edges will thus ensure, at least when care is taken to select a sufficiently small frictional resistance of the epoxy at the position of the positioning edges, that a separated electronic component which is not presented in completely accurate manner can nevertheless be placed in a very precisely determined position. It is precisely when the positioning edges are applied that a significant advantage becomes even more important. The contract between the epoxy carrier structure and the separated electronic components can be chosen such that the visual inspection, particularly of the periphery of the separated electronic components, is not impeded by the positioning edge. In traditional carriers for separated electronic components in which recesses with positioning edges are arranged measurement inaccuracies can result on one or more sides of the separated electronic components due to the shadow effect of the positioning edge; the periphery of the separated electronic components can usually not then be discerned properly. This problem can be obviated using a carrier according to the present invention, with which a contrast can be achieved between the epoxy carrier structure and the separated electronic components such that the periphery of the separated electronic components can be discerned visually in accurate manner.

As an alternative to the receiving spaces recessed into the epoxy, the holders for the separated electronic components, optionally in combination with holders in other form, can consist of epoxy carrying elements projecting (i.e. protruding) from the epoxy surface. Such protruding epoxy carrying elements are also referred to as "pillars". The advantage of the protruding epoxy carrying elements is that the separated electronic components can be positioned "floating" (i.e. with a periphery wholly or partially clear of the epoxy); this for instance makes it more readily possible to visually inspect the upright edges of the separated electronic components.

The epoxy of the carrier structure is preferably introduced as moulding resin into the recessed space in the flat metal platform. Other plastics (such as for instance perspex or acrylate) could however also be applied for the carrier structure, although a form-fitting coupling to the recessed space in the flat metal platform will then have to be brought about in a different manner. In respect of the physical properties of the epoxy to be applied, the hardness is preferably [70-90] Shore D and the electrical resistance value lies between 105-109 Ohm. Such a dissipation value can be obtained by admixing a conductor, for instance a metal such as Al or Ag, to the epoxy of the carrier structure. The surface roughness of the epoxy can for instance be influenced so as to thus determine the non-transparency or other aspects relating to the surface quality. After a milling process on the epoxy it is thus possible to opt to abrade the epoxy material (tribo finish) so as to thus remove the shine which is present like a mirror. With such a surface roughness the epoxy is sufficiently matt to prevent reflection impeding visual detection.

The flat metal carrier structure is manufactured from a metal such as for instance aluminium. Aluminium is advantageous because of its relatively limited weight and is sufficiently strong. With such a choice of metal a sufficiently strong carrier can be assembled, the weight of which remains limited. This relatively limited weight is relevant in respect of the fact that the carriers are normally used as transport holders.

In another variant the holders for the separated electronic components which are formed by the epoxy of the carrier structure are provided with suction openings which are connected to at least one central suction line. An underpressure (for instance in the order of magnitude of 100-300 mbar or lower) can be applied to the suction openings, whereby the separated electronic components, once they have been positioned, are held in place; this has the result that the separated electronic components will also remain in position in the case of limited acceleration and/or deceleration of a loaded carrier.

In yet another variant the epoxy carrier structure is illuminated in a manner such that the light excitation takes place more or less uniformly over the whole contact surface. The thus obtained background illumination makes it possible to detect the periphery of the separated electronic components with even greater accuracy.

The present invention also comprises a method for visual inspection of separated electronic components with the processing steps of: A) loading a flat carrier as described above with a number of separated electronic components; B) relatively displacing the carrier loaded with separated electronic components relative to a camera; and C) visually inspecting the separated electronic components held by the carrier using the camera. It is important here that the separated electronic components are brought with a minimum accuracy into a secured position during processing step A) using positioning edges arranged in the epoxy carrier structure. The dimensions of recesses in the epoxy carrier structure can for instance thus be embodied with an overmeasure of for instance ±50 µm, and oblique entry edges (positioning edges) can be provided of for instance 0.1 mm width. In such an embodiment a variation in the presenting position of a maximum of 150 µm in the surface of the carrier structure can thus still be compensated and corrected. Using such a method the advantages can be realized as already described above with reference to the carrier according to the present invention; the above stated advantages are also incorporated here by way of reference in relation to the method according to the invention.

In a variant of the method according to the present invention an electrostatic charge present in the epoxy carrier structure is at least partially discharged by means of an ionized gas flow. Reference has already been made above to a dissipative capacity of the epoxy carrier structure which in a preferred variant lies between 1.105-1.109 Ohm. With such an epoxy carrier structure electrostatic charge can be discharged without the risk of a peak voltage being applied to the electrostatic charge. It is however also possible for (a part of the) electrostatic charge to be discharged by means of an ionized gas flow; this makes it possible to further limit the danger of ESD even in epoxy carriers with limited dissipative capacity (1.105-1.109 Ohm or even less).

In order to prevent displacement of the separated electronic components relative to the carrier, it is possible to opt to secure the mutual positions of the separated electronic components and the holders for the separated electronic components by means of under pressure.

BRIEF DESCRIPTION OF THE DRAWINGS

The invention will be further elucidated on the basis of the following non-limitative exemplary embodiments. Herein.

DETAILED DESCRIPTION OF THE PREFERRED EMBODIMENTS

Figure 1:
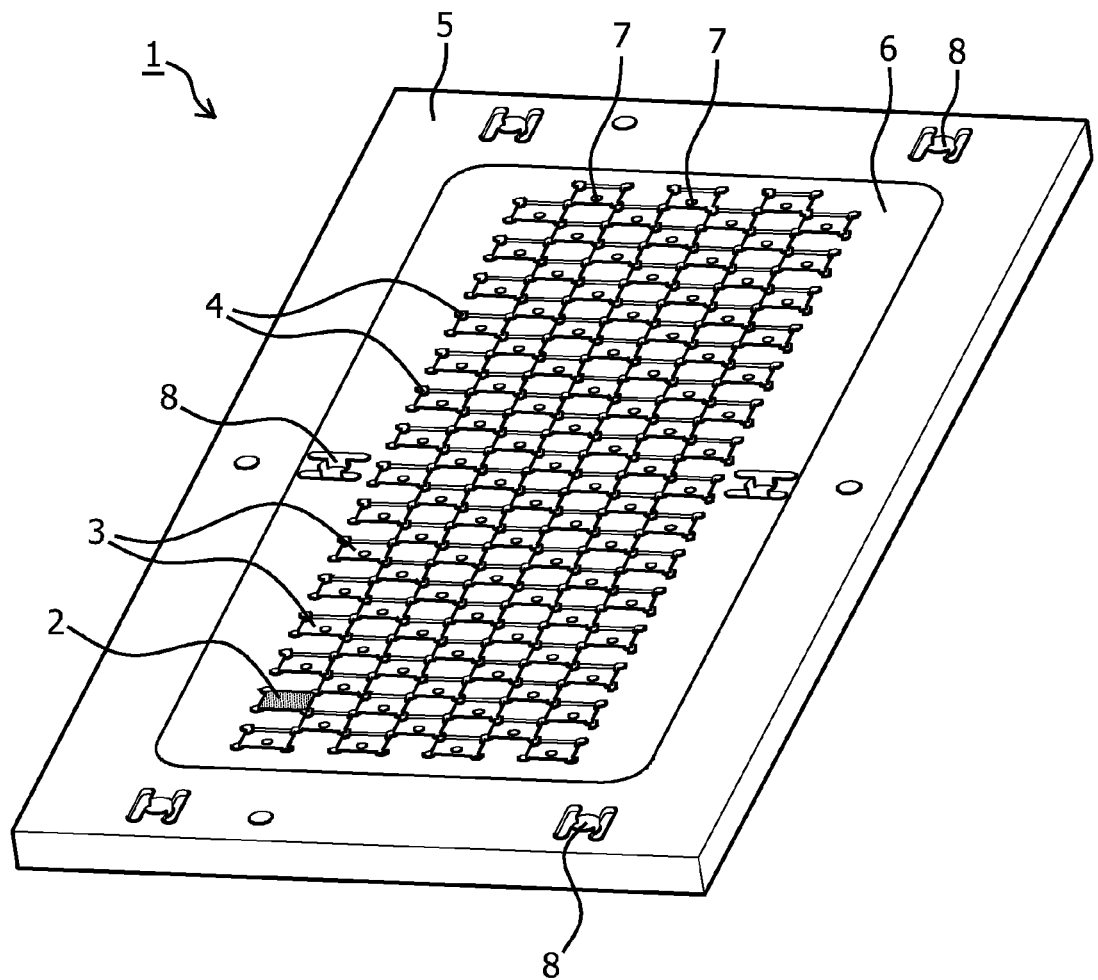
FIG. 1 is a perspective view of a carrier for separated electronic components according to the present invention.

FIG. 1 is a perspective view of a carrier 1 for separated electronic components, only one electronic component 2 of which is shown. Carrier 1 is provided for this purpose with holders 3 in the form of recesses distributed in a "checkerboard pattern" over carrier 1 such that the longitudinal sides of all holders 3 are left free. All corner points of the holders are moreover provided with a recess 4 surrounding the corner points. The advantage of recesses 4 is that the corners of the electronic components 2 to be placed in holders 3 lie clear of carrier 1, this facilitating the visual inspection and making carrier 1 less vulnerable. The carrier is constructed from a flat metal platform 5 in which a central space is left clear, in which an epoxy carrier structure 6 is arranged. The epoxy carrier structure 6 is only accessible from one of the flat sides of platform 5. Holders 3 for the separated electronic components 2 are recessed into the epoxy carrier structure 6. Further shown in this figure is that all holders 3 are provided with a central opening 7 with which electronic components 2 placed in holders 3 can be suctioned. Provided in the carrier for the purpose of positioning carrier 1 relative to a processing station (not further shown here) are positioning openings 8 into which reference pins can be placed.

Figure 2:
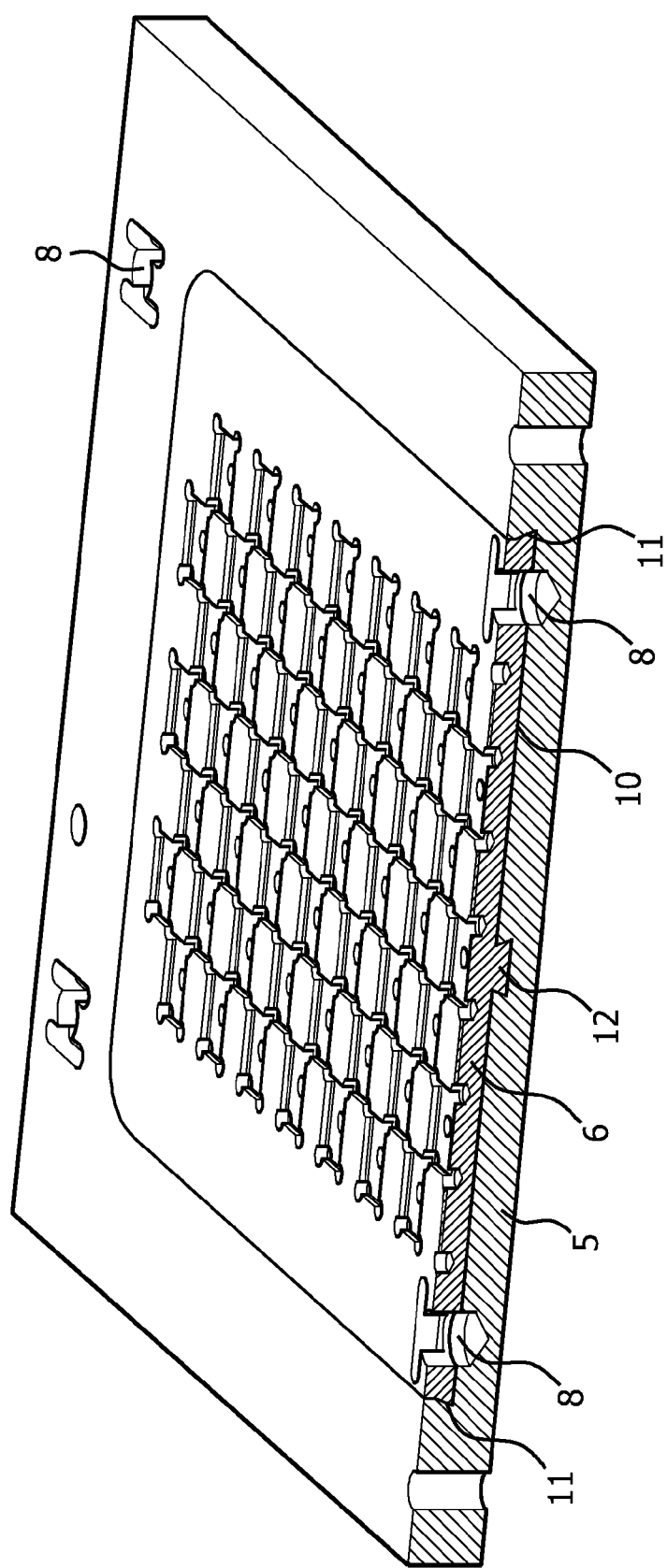
FIG. 2 is a perspective view of a cross-section of the carrier for separated electronic components according to claim 1.

FIG. 2 is a perspective view of a cross-section through carrier 1 of FIG. 1, in which can be seen that the epoxy carrier structure 6 is arranged form-fittingly in metal platform 5. A space 10 is recessed into metal platform 5. Edges 11 of this space 10 are undercut and a dovetail groove 12 is arranged on the underside. The epoxy carrier structure 6 fits closely to the walls of space 10, for instance because the epoxy is poured into space 10, such that due to the connection of epoxy carrier structure 6 to the undercut edges 11 and dovetail groove 12 there is a form-fitting coupling between metal platform 5 and epoxy carrier structure 6.

In addition to the shown embodiment of the carrier according to the present invention, there are of course many possible variations within the scope of the present invention. Metal components could for instance also be arranged in (cast into) the epoxy carrier structure 6, for instance in the form of cups, in order to thus increase the resistance to wear.

The invention claimed is:

1. A flat carrier provided with holders for separated electronic components, suitable for use in a method for visual inspection of separated electronic components, comprising:
   a flat metal platform provided with a space recessed into the flat metal platform, which recessed space is opened to one of the flat sides of the flat metal platform, and
   a plastic carrier structure arranged form-fittingly in the recessed space,
   wherein the holders for the separated electronic components are formed from the carrier structure made of plastic, wherein the form-fitting arrangement is such that a contact side of the plastic carrier structure and an edge of the metal platform connecting thereto connect to each other in one surface,
   wherein the holders for the separated electronic components are formed by receiving spaces recessed into the plastic,
   wherein the receiving spaces recessed into the plastic are provided with chamfered positioning edges, and
   further wherein the plastic of the carrier structure is mixed with a conductor.

2. The flat carrier as claimed in claim 1, wherein the space recessed into the flat metal platform is opened to only one of the flat sides of the flat metal platform.

3. The flat carrier as claimed in claim 1, wherein the holders for the separated electronic components are formed by protruding plastic carrying elements.

4. The flat carrier as claimed in claim 1, wherein the plastic of the carrier structure is introduced as moulding resin into the recessed space in the flat metal platform.

5. The flat carrier as claimed in claim 1, wherein the flat metal platform is manufactured from aluminium.

6. The flat carrier as claimed in claim 1, wherein the plastic has an increased surface roughness in that the surface is abraded.

7. The flat carrier as claimed in claim 1, wherein the holders for the separated electronic components which are formed by the plastic of the carrier structure are provided with suction openings which are connected to at least one central suction line.

8. A method for visual inspection of separated electronic components, comprising the processing steps of:
   A) loading a number of separated electronic components into a flat carrier provided with holders for separated electronic components, the flat carrier comprising:
      a flat metal platform provided with a space recessed into the flat metal platform, which recessed space is opened to one of the flat sides of the flat metal platform, and
      a plastic carrier structure arranged form-fittingly in the recessed space,
      wherein the holders for the separated electronic components are formed from the carrier structure made of plastic, wherein the form-fitting arrangement is such that a contact side of the plastic carrier structure and an edge of the metal platform connecting thereto connect to each other in one surface,
      wherein the holders for the separated electronic components are formed by receiving spaces recessed into the plastic,
      wherein the receiving spaces recessed into the plastic are provided with chamfered positioning edges, and
      further wherein the plastic of the carrier structure is mixed with a conductor;
   B) relatively displacing the carrier loaded with separated electronic components relative to a camera; and
   C) visually inspecting the separated electronic components held by the carrier using the camera.

9. The method as claimed in claim 8, wherein the separated electronic components are brought with a minimum accuracy into a secured position during processing step A) using positioning edges arranged in the plastic carrier structure.

10. The method as claimed in claim 8, wherein an electrostatic charge present in the plastic carrier structure is at least partially discharged by means of an ionized gas flow.

11. The method as claimed in claim 8, wherein the mutual positions of the separated electronic components and the holders for the separated electronic components are secured by means of underpressure.

* * * * *